United States Patent [19]

Mendel et al.

[11] Patent Number: 6,043,676
[45] Date of Patent: Mar. 28, 2000

[54] WIDE EXCLUSIVE OR AND WIDE-INPUT AND FOR PLDS

[75] Inventors: David W. Mendel, Sunnyvale; Brent A. Fairbanks, Santa Clara; Bruce B. Pedersen, San Francisco, all of Calif.

[73] Assignee: Altera Corporation, San Jose, Calif.

[21] Appl. No.: 08/825,821

[22] Filed: Mar. 28, 1997

Related U.S. Application Data

[63] Continuation-in-part of application No. 08/497,165, Jun. 30, 1995, abandoned, and a continuation-in-part of application No. 08/508,277, Jul. 27, 1995, abandoned, said application No. 08/497,165, is a continuation-in-part of application No. 08/334,879, Nov. 4, 1994, abandoned.

[51] Int. Cl.[7] .............................................. H03K 19/177
[52] U.S. Cl. ............................................. 326/39; 326/41
[58] Field of Search ................................ 326/39–41, 47, 326/52, 54–55

[56] References Cited

U.S. PATENT DOCUMENTS

| | | | |
|---|---|---|---|
| 4,525,714 | 6/1985 | Still et al. | 326/39 |
| 4,855,954 | 8/1989 | Turner | 326/39 |
| 5,122,685 | 6/1992 | Chan et al. | 326/40 |
| 5,144,166 | 9/1992 | Camarota et al. | 326/41 |
| 5,245,227 | 9/1993 | Furtek et al. | 326/40 |
| 5,341,044 | 8/1994 | Ahanin et al. | 326/39 |
| 5,350,954 | 9/1994 | Patel | 326/39 |
| 5,365,125 | 11/1994 | Goetting et al. | 326/39 |
| 5,399,922 | 3/1995 | Kiani et al. | 326/40 |
| 5,455,525 | 10/1995 | Ho et al. | 326/41 |
| 5,489,857 | 2/1996 | Agrawal et al. | 326/41 |

*Primary Examiner*—Jon Santamauro
*Attorney, Agent, or Firm*—Townsend and Townsend and Crew LLP

[57] ABSTRACT

A programmable logic device (10) has a number of programmable logic elements (LES) (12) which are grouped together in a plurality of logic array blocks (LABs) (14). An LAB incorporates one or more wide-input AND gates (74) for selectively combining the outputs of any number of LEs and producing a signal that is a logical combination of any number of its LEs. In variations of the invention, input signals may be selectively coupled to an AND gate by means of an OR gate (78) and may be selectively inverted by means of an XOR gate (76). A digital information processing system (500) incorporating the invention is disclosed. Various circuit techniques are provided for efficient implementation of a fast and wide exclusive OR or exclusive NOR function. A logic array block is equipped with a dedicated exclusive OR circuit with programmable inputs connected to selected terms from various logic cells, or outputs of the various logic cells. Another embodiment allows creating an embedded chain of exclusive OR gates to implement a wide exclusive OR gate by cascading a smaller exclusive OR gate within several logic cells.

32 Claims, 8 Drawing Sheets

WIDE EXCLUSIVE OR AND WIDE-INPUT AND FOR PLDS

This application is a continuation-in-part of Ser. No. 08/497,165, filed Jun. 30, 1995, now abandoned, and Ser. No. 08/508,277, now abandoned, filed Jul. 27, 1995, both of which are incorporated herein by reference for all purposes. Ser. No. 08/497,165 is a continuation-in-part of Ser. No. 08/334,879 filed Nov. 4, 1994, now abandoned.

BACKGROUND OF THE INVENTION

The present invention relates generally to programmable logic devices (PLDs), and in particular to various circuit techniques to provide dedicated exclusive OR (XOR) function in complex PLDS.

Programmable logic devices are digital, user-configurable integrated circuits used to implement custom logic functions. For the purposes of this description, the term PLD encompasses all digital logic circuits configured by the end-user, including programmable logic arrays (PLAs), field programmable gate arrays (FPGAs), erasable and complex PLDs and the like. Such devices are sometimes referred to as, for example, PALs, FPLAs, EPLDs, EEPLDs, LCAs, CPLDs, and FPGAs. The basic building block of a PLD is the logic cell, sometimes referred to as a macrocell. Typically, a logic cell contains combinatorial logic as well as a programmable flipflop to implement sequential logic. One class of PLDs commonly employs a sum-of-products structure to implement logic functions. In such PLDS, the combinatorial logic in each logic cell includes a set of wide-input AND gates that generate the product terms or p-terms. The p-terms are then fed into the inputs of an OR gate to compute the sum. Since all combinatorial logic can be reduced to a sum-of-products expression, the AND-OR array can produce any Boolean function. Highly complex logic functions can be implemented by combining or cascading large numbers of such logic cells.

One logic function that a p-term based structure cannot implement very efficiently is a wide exclusive OR type circuit. It is to be understood that the terminology "exclusive OR type circuit" refers to both exclusive OR (XOR) and exclusive NOR (XNOR) gates. A typical logic function that requires a wide XOR or XNOR is a parity checker or parity generator. A parity bit is set or reset by the output of a wide XOR gate that receives multiple data bits at its inputs. In conventional p-term based PLDS, implementing such a parity generator requires a large number of p-terms and therefore quite a few logic cells. Using as an example the basic logic cell in Altera's MAX 7000 PLD, implementing an 8 bit XOR would require a total of 65 p-terms. A 65 p-term solution uses the already existing XOR gate in each logic cell and the parallel expander feature of the device. With 5 p-terms per logic cell, this XOR uses 13 logic cells to implement. A less logic intensive approach would use two logic cells each implementing a 4-bit XOR, with their outputs fed into a third logic cell to perform another level of XOR on the signals. This solution uses three logic cells, but is considerably slower since it requires two stages of logic. Thus, implementing wide XOR with conventional p-term based PLD logic cells is either costly in terms of amount of logic required or slow. In one embodiment the present invention provides an improved programmable logic device with a LAB-based wide AND gate for enhanced LAB functionality as well as associated methods of operation. There is therefore a need for p-term based PLDs with faster and more efficient wide XOR capability.

PLDs, while similar in some aspects of overall functionality, may be of very different types in terms of circuit architecture. One family of PLDs uses a sum-of-products (SOP) architecture whereby each output is the ORed sum of a number of ANDed product terms of the inputs. This family is represented by the Altera MAX® and CLASSIC™ 5000 EPLDs. Another family of PLDs uses look-up tables (LUTs) to perform logic functions. This family is represented by the Altera FLEX® EPLDs.

Modern PLDs generally are constructed from small functional units variously referred to as logic modules or macrocells and herein referred to as logic elements (LEs). These LEs are typically identical or nearly identical throughout the PLD and perform a function that is a sub unit of the function of the entire PLD. For example, in a PLD based on an LUT architecture, the LEs might each be four input/one output LUTs. PLDs generally include an interconnect structure of conductors to provide a mechanism for selectively connecting the inputs and outputs of the LEs in order to perform the PLD functionality.

Larger PLDs of both the SOP and LUT type generally group the smaller LEs into larger functional units herein referred to as logic array blocks (LABs). The LABs can contain within them a local LAB interconnect that allows signals in one LE to be selectively connected to signals in a different LE in the same LAB and that transmits signals from the global interconnect to the inputs of the individual LEs. The LABs may be connected to one another and to input and output circuits by means of the global interconnect.

While such devices have met with substantial success, such devices also meet with certain limitations.

For example, PLDs with a LAB-based structure typically group a number of LEs together into one LAB, in a specific embodiment each LAB has eight LEs. Each LE generally has one output which is a programmable function of its inputs. A typical number of inputs for an LE is four. A typical prior art LAB thus has eight outputs, one output for each of its eight LEs. In such a prior art LAB, the eight outputs are generally not combinable in that LAB. If a user wishes to have a function that is a logical combination of the outputs of a LAB, the outputs of that LAB must be routed through the global interconnect to another LAB in the PLD and made the inputs to another LE which may then combine the signals. This results in an additional level of delay for these logic signals and in use of additional LEs on the PLDs which then can't be used for other functions.

From the above it is seen that an improved programmable logic device is desired.

SUMMARY OF THE INVENTION

The present invention offers several circuit techniques that provide efficient and fast wide XOR capability for logic cells in p-term based PLDs . In one embodiment, the invention provides a dedicated wide XOR circuit that receives the outputs of a group of logic cells. In another embodiment, a dedicated wide XOR programmably receives multiple p-terms, one from each logic cell in a group of cells. In a third embodiment, a logic cell is provided with an internal XOR gate and multiplexers that allow for programmably cascading several logic cells to implement a wide XOR function. Several other embodiments are also presented that provide variations on the third embodiment with more logic flexibility.

The invention also provides an embodiment wherein an improved programmable logic device for use in digital circuits and systems in which a LAB is provided with one or more selectable wide-input AND gate on its outputs for selectively combining any of its output signals. This design allows for far larger and more complex logic functions to be implemented in a single LAB than in prior art PLDs. This improves the routing and programmability of LABs by not requiring that output signals from an LAB be routed to another LAB in order to be logically combined.

A computer system or other digital processing machine incorporating the invention will benefit from the added flexibility and reprogrammability of the PLD.

A better understanding of the nature and advantages of the present invention may be had with reference to the descriptions and drawings below.

DESCRIPTION OF THE PREFERRED EMBODIMENT

Figure 1:
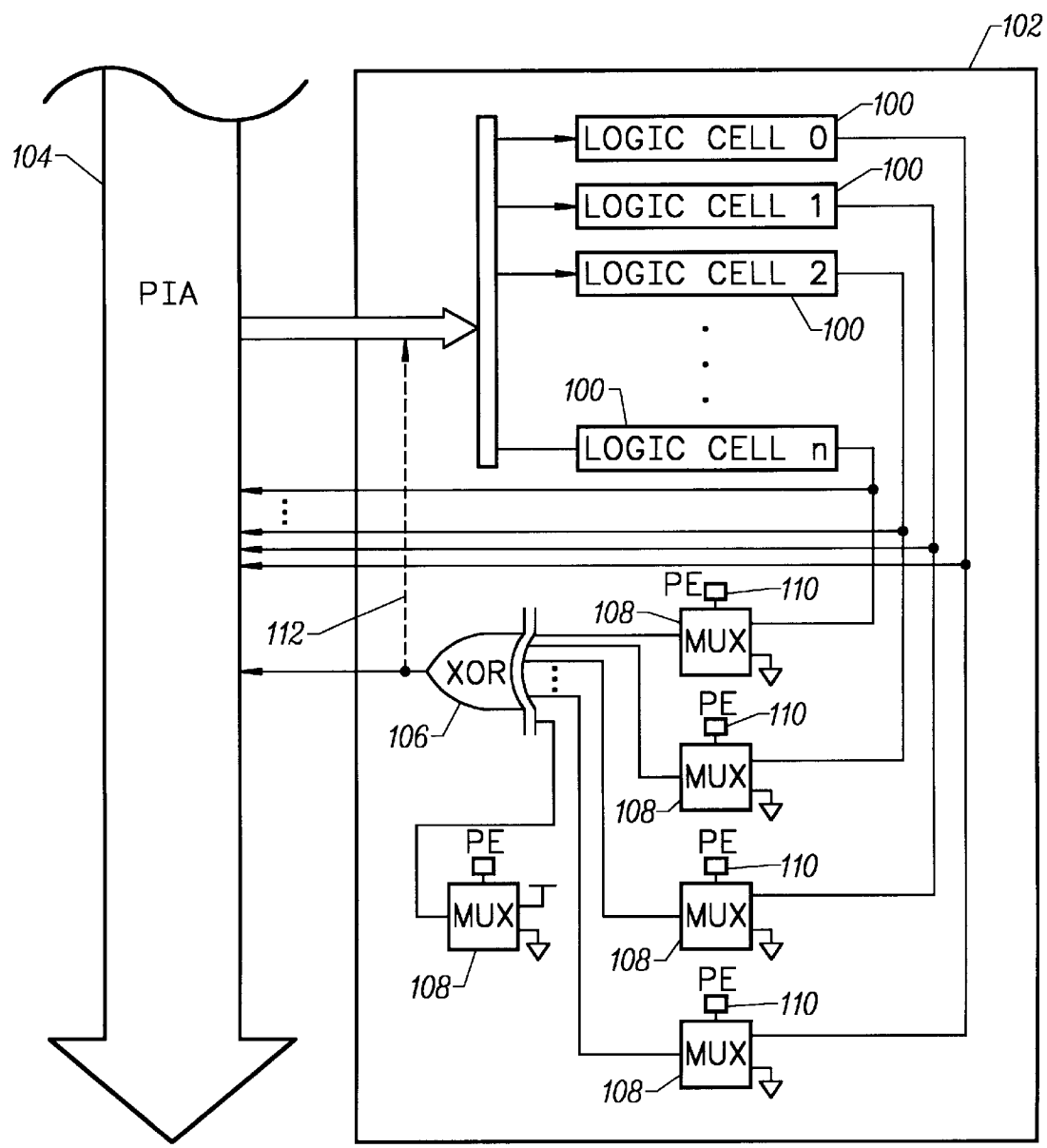
FIG. 1 shows a dedicated wide XOR for a p-term based PLD wherein the wide XOR receives logic cell outputs.

Referring to FIG. 1 there is shown a portion of a programmable logic device (PLD) including n logic cells 100 that are grouped into a logic array block (LAB) 102. Such PLD devivces may be, for example, as described in U.S. Pat. Nos. 5,121,006, 5,258,668, 5,260,610, and 5,260,611, all incorporated herein by reference for all purposes. The inputs and outputs of logic cells 100 connect to a programmable interconnect array (PIA) 104. PIA 104 provides programmable interconnection between logic cells 100 inside multiple LABs 102 on a PLD, only one of which is shown in FIG. 1. In this embodiment of the present invention, LAB 102 includes a dedicated XOR 106 with n inputs equal to the number of logic cells 100 inside LAB 102. LAB 102 further includes one select circuit or multiplexer 108 for each input of XOR 106. Each multiplexer 108 has one input connected to a logic cell 100 output, a second input connected to a logic low level (e.g., ground as shown in FIG. 1), a control input connected to a programmable element 110, and an output connected to an input of XOR 106. The output of XOR 106 can feed the PIA 104 as an additional output of LAB 102. In an architecture with local feedback within a LAB, the XOR 106 output can also feed back as an input to the host LAB 102, as shown by the broken line 112.

If a particular output of a logic cell 100 is not to be used as an input to XOR 106, the respective programmable element 110 can control its associated multiplexer 108 to apply a logic low level as the input to XOR 106. Any one of a variety of volatile or non-volatile programmable storage elements (e.g. static or dynamic random access memory, EPROM, or EEPROM), fuses, or antifuses can be used as programmable element 110. Multiplexers 108 thus allow the user to programmatically route logic cell outputs to the wide XOR. It will be recognized that the attached figures are merely illustrative of techniques for performing XOR functions. For example, an XOR of four inputs [XOR(a,b,c,d)] can be performed as an XOR(XOR(a,b); XOR(c,d)) or any of a wide variety of other combinations. To implement a wide XNOR gate, a programmable inverter can be placed at the output of XOR 106. A preferred alternative adds an extra input to gate 106 and programmably connects (i.e., via an additional MUX 108) the input to logic low (ground or some other selected reference voltage) or logic high (positive power supply or some different reference voltage) levels as shown in FIG. 1. An alternative embodiment provides for an XOR of n-1 terms with a programmable invert control for the n'th input of the XOR logic. Still further alternative logic paths include the generation of a signal and its complement. A MUX then inputs and selects between the signal and its complement. Many other logical XOR implementations will be apparent to those of skill in the art. All or selected blocks of logic (LABS) in a PLD can thus be equipped with a dedicated n-wide XOR (or XNOR) which allows the PLD to programmatically perform fast wide XOR functions efficiently.

Figure 2:
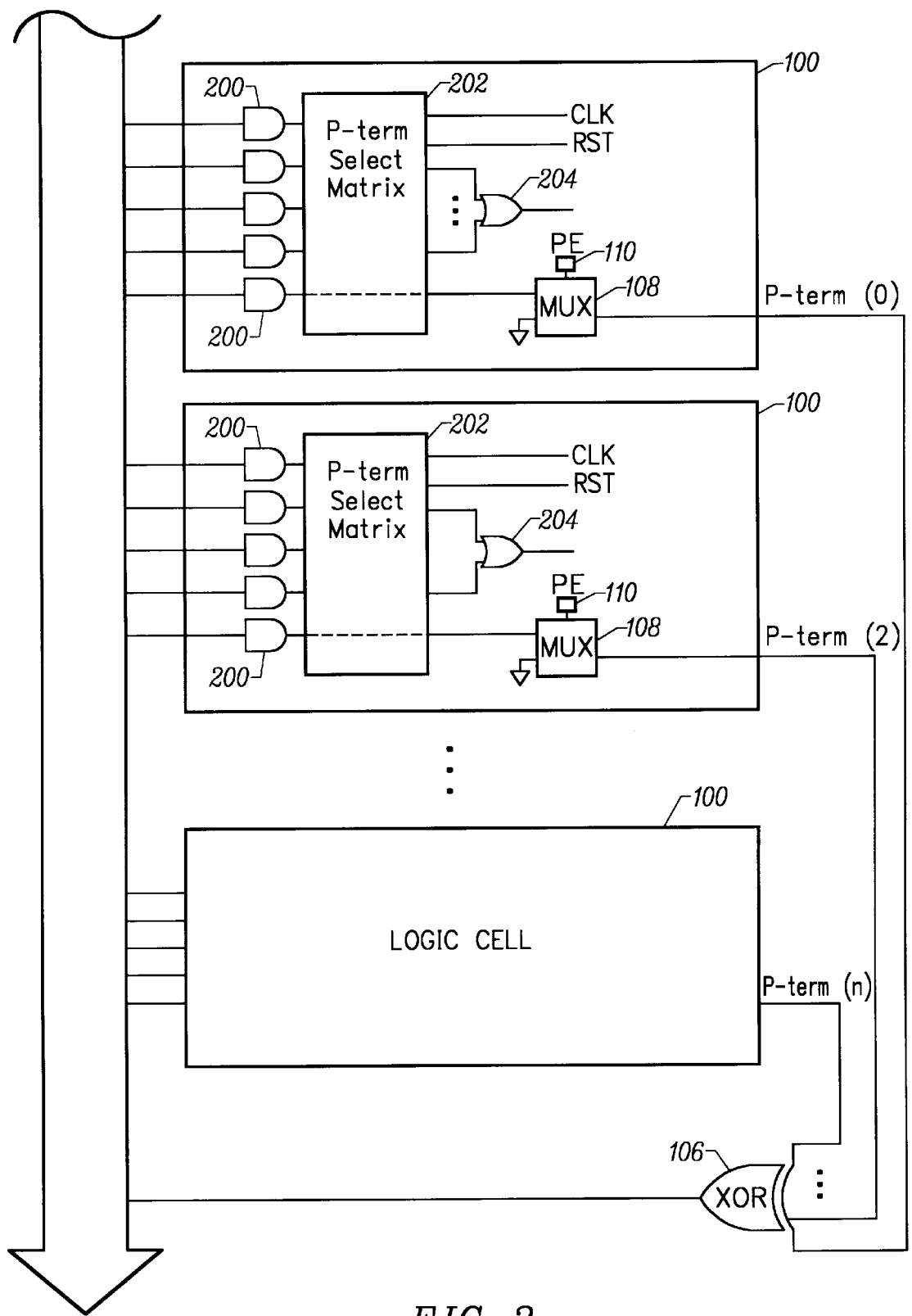
FIG. 2 is another embodiment for a wide XOR in a p-term based PLD wherein the wide XOR receives logic cell p-terms.

A more sophisticated p-term based PLD such as Altera's MAX 7000 allows a given p-term in a logic cell to be used for different purposes. The second embodiment of the present invention as shown in FIG. 2 combines the dedicated wide XOR of the first embodiment with the multi-purpose p-term concept. FIG. 2 shows a simplified diagram of a logic cell 100 that includes a bank of AND gates 200 that generate all of the p-terms. A p-term select matrix 202 receives all of the p-terms and programmably routes them either to the inputs of a wide OR gate 204 as primary logic inputs or to secondary signal lines used for other functions such as clock and preset for the cell's register, or other similar signals. According to this embodiment of the present invention, logic cell 100 includes further select circuits or multiplexers, possibly as part of p-term select matrix 202, to route one or more of the p-terms to inputs of a dedicated wide XOR 106. For a LAB 102 with n logic cells 100, it would require one additional multiplexer per logic cell to route one p-term to an n-wide XOR 106. The use of a p-term instead of a logic cell output as inputs to the dedicated XOR allows the rest of the circuitry within a logic cell to be used for other logic functions.

Figure 3:
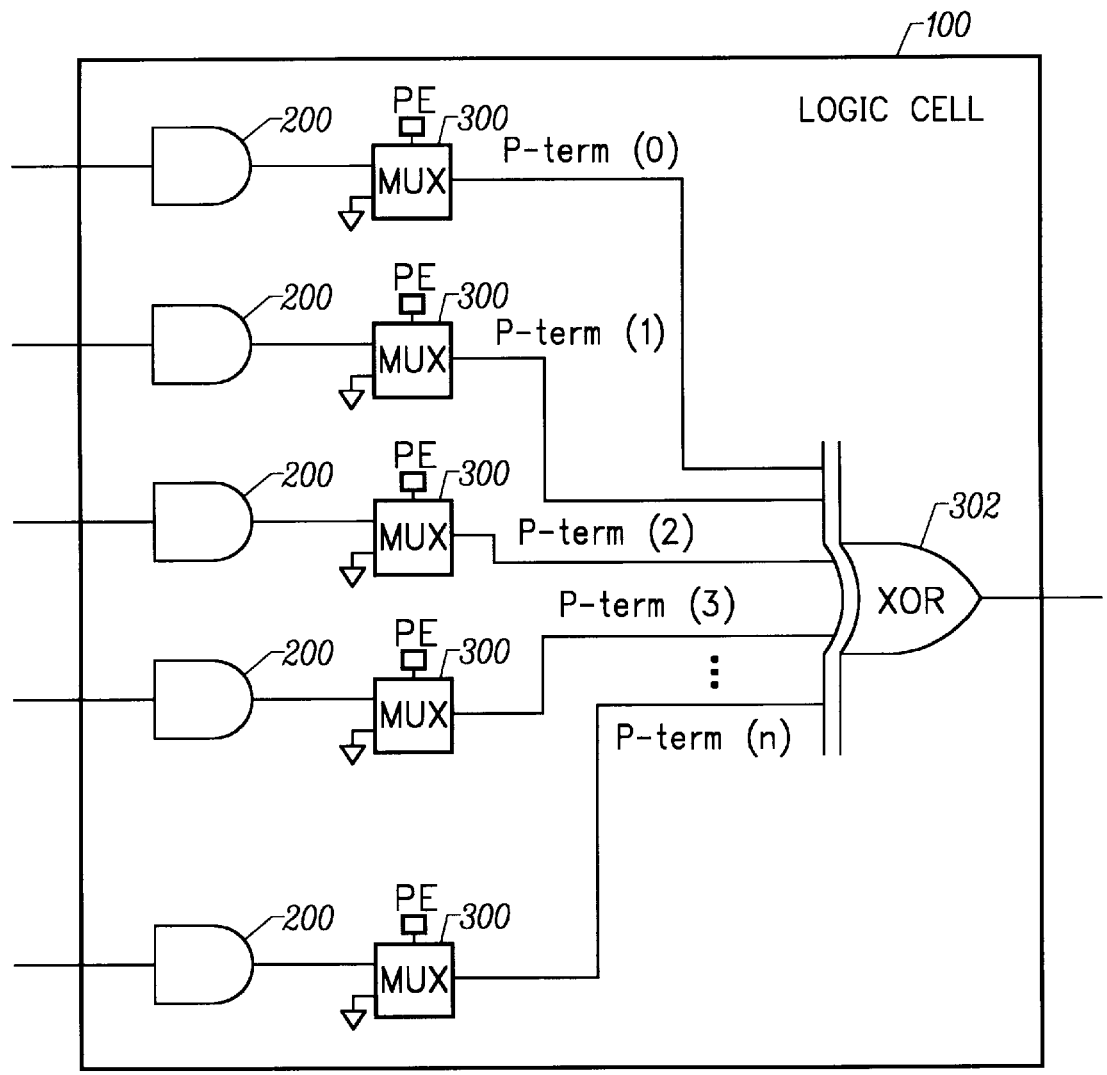
FIG. 3 shows a dedicated XOR logic cell for a p-term based PLD.

Another embodiment of the present invention dedicates an entire logic cell to the function of wide XOR. FIG. 3 is a diagram of a dedicated wide XOR logic cell. A pre-defined number n (for example 8, 16, or 32) of product terms are generate by a bank of AND gates 200. The outputs of AND gates 200 connect to one input of a respective multiplexer 300. The other input of multiplexer 300 connects either to ground or the power supply, while its output connects to an input of an n-wide XOR 302. This dedicated wide XOR logic cell eliminates the need for engaging multiple logic cells to implement a wide XOR function.

Figure 4:
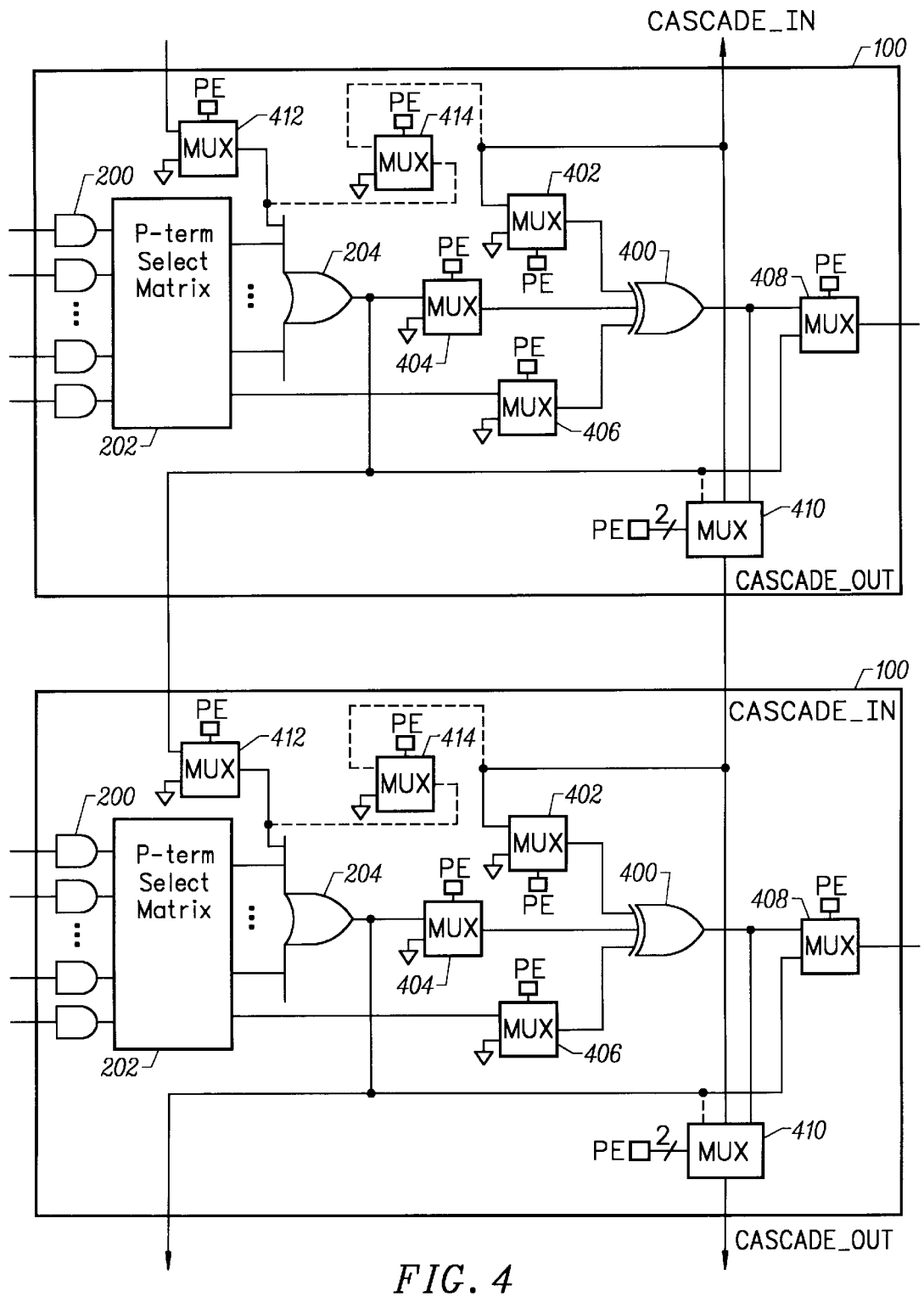
FIG. 4 shows logic cells for a PLD wherein a small XOR gate internal to a logic cell is expandable to implement a wide embedded XOR function by cascading several logic cells.

The above embodiments require additional hardware to implement a dedicated wide XOR gate. It is, however, possible to implement a wide XOR by cascading smaller XOR gates inside logic cells that are otherwise used as primary logic cells. The logic cell used in Altera's MAX 7000, for example, includes a 2-input XOR gate to facilitate implementation of combinational logic. According to another embodiment of the present invention, multiplexers can be added that permit programmable cascading of such already existing XOR gates. FIG. 4 shows a partial schematic of two cascaded logic cells 100 according to a fourth embodiment of the present invention. Each logic cell 100 includes, in addition to the bank of AND gates 200, p-term select matrix 202 and OR gate 204, a three-input XOR gate 400 with programmable inputs. The programmability of the inputs of XOR 400 is provided by three select circuits or multiplexers 402, 404 and 406, each having an output connected to an input of XOR 400. The control input of each one of the multiplexers 402, 404 and 406 connects to a programmable element 110. Multiplexer 402 connects the first input of XOR 400 either to ground (logic low), or to an cascade signal Cascade_XOR_In from a preceding logic cell. Multiplexer 404 connects the second input of XOR 400 either to ground, or to the output of OR 204. Multiplexer 406 connects the third input of XOR 400 either to ground, or to a p-term. Multiplexer 406 can reside inside p-term select matrix 202.

Two more multiplexers 408 and 410 add further flexibility to the logic cell of the present invention. Multiplexer 408 receives the output of XOR 400 as one input and the output of OR 204 as another input. The control terminal of multiplexer 408 connects to a programmable element 110 and the output of multiplexer 408 drives the remaining circuitry (not shown) inside, and optionally the output of, logic cell 100. Multiplexer 410 also receives the output of XOR 400 as one input and the Cascade_In signal as another input. The control terminal of multiplexer 410 connects to a programmable element 110 and the output of multiplexer 410 generates the signal Cascade_Out that feeds into the succeeding logic cell.

In operation, multiplexer 402 allows for the cascading of XORs 400 inside several logic cells to implement a wide XOR function. Multiplexer 402 can be programmed to connect the Cascade_In signal to one input of XOR 400, while multiplexer 406 is programmed to connect a selected p-term to another input of XOR 400. With multiplexer 404 programmed to ground the third input of XOR 400, the XOR function is expanded by one additional p-term. The same programming in several successive logic cells results in an embedded XOR chain to create a wide XOR.

To be able to use the output of OR 204 while implementing an embedded wide XOR, multiplexer 408 has been added. When programmed to select the output of OR 204, multiplexer 408 allows the embedded XOR gate to simultaneously snake through several logic cells as OR 204 freely feeds the logic of its corresponding register.

Multiplexer 410 provides for the option of bypassing the XOR gate of a given cell. When creating an XOR chain, if a mid-chain logic cell needs its XOR for other logic functions, the XOR chain can bypass this cell and continue the chain with the next logic cell. This is accomplished by programming multiplexer 410 to select the Cascade_In signal to connect to its output (Cascade_Out) instead of the output of XOR 400.

The logic cells can also provide for cascading of other logic resources such as the OR gate (204). In the present invention, the cascading of the OR gate can be accomplished in one of two ways. FIG. 4 shows the conventional expander technique which employs an additional multiplexer 412 that receives the output of OR 204 as an input and feeds its output to an input of OR gate 204 of the next logic cell 100. FIG. 4 also show in broken lines an alternate embodiment whereby the inter-cell cascade line is shared for XOR 400 and OR 204. In this embodiment MUX 410 receives the output of OR 204 as a third input. The control line for MUX 410 would be a 2-bit signal to choose one out of three inputs. Another multiplexer MUX 414 receives the Cascade_In signal as one input and ground as the other input. The output of MUX 414 connects to an input of OR 204. In the first embodiment using MUX 412 (shown in solid lines) the cascading of XOR 400 and OR 204 would required two separate inter-cell cascade lines. In the second embodiment using MUX 414 (shown in broken lines) there is only a single connector line that travels between logic cells 100, which limits the expanding capability to either OR 204 or XOR 400. It is to be understood that the logic cell would be designed with one or the other of these embodiments and not both.

WIDE INPUT AND

For the sake of clarity, the invention will be explained with reference to a PLD architecture that was disclosed in co-assigned U.S. Pat. No. 5,260,611 (the '611 patent) which is incorporated herein by reference. Some figures from that patent are reproduced here to aid in an understanding of the invention. However, it will be apparent to one skilled in the art that the invention may be used in a very wide variety of different PLD architectures including architectures that are fundamentally different from that disclosed in the '611 patent.

Figure 5:
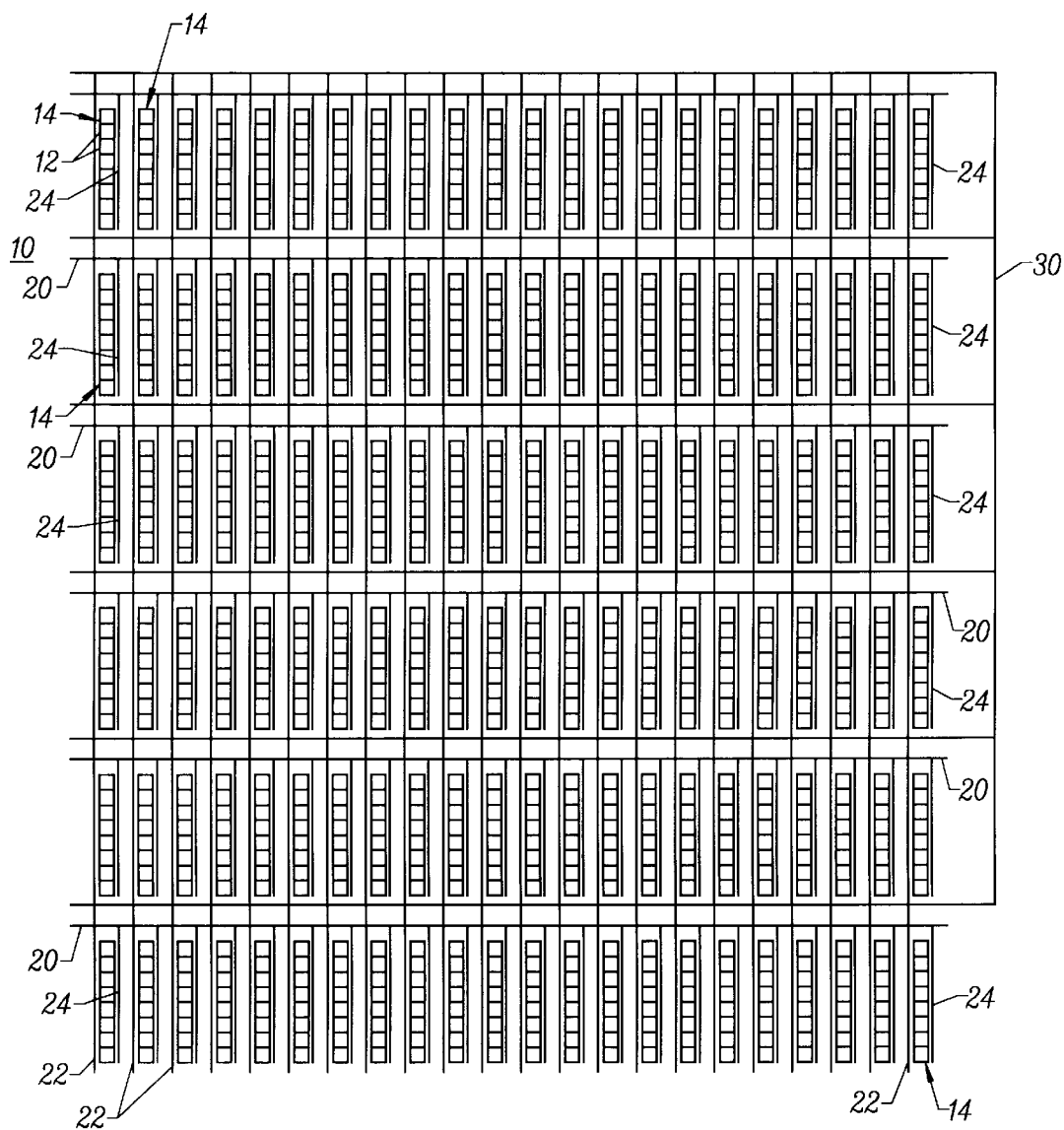
FIG. 5 is a simplified block diagram of a prior art PLD.

FIG. 5 shows the overall organization of an illustrative prior art PLD integrated circuit 10. Many details of this circuit not necessary for an understanding of the present invention are discussed in co-assigned U.S. Pat. No. 5,260, 611. Not all of the conductors employed in circuit 10 are shown in FIG. 5, but enough is shown in this figure for the present discussion. Each LE 12 is represented by a small square in FIG. 5. LEs 12 are grouped together in groups of eight in this particular example. Each of these groups is referred to as a logic array block (LAB) 14. LABs 14 are arranged in six horizontal rows and twenty two vertical columns on circuit 10. Accordingly, there are a total of one hundred thirty two LABs 14 and one thousand fifty six LEs 12 on circuit 10. Each LE 12 is capable of performing a relatively elementary logic function, but extremely complex logic can be performed by variously interconnecting the LEs.

The interconnection circuitry shown in FIG. 5 includes groups of so-called global horizontal conductors (or global horizontal interconnect) 20 interspersed between the horizontal rows of LABs and groups of global vertical conductors (or global vertical interconnect) 22 interspersed between the vertical columns of LABS. These conductors are global in the sense that they extend along an entire row or column of LABs and are not localized to one LAB. Programmable interconnections can be made between select intersecting horizontal and vertical conductors in order to apply signals on the vertical conductors to the horizontal conductors. Although other numbers of conductors can be used if desired, in the depicted embodiment, there are one hundred seventy six conductors in each group of global horizontal conductors 20 and sixteen conductors in each group of global vertical conductors 22. In one specific embodiment, programmable connections are possible between a vertical conductor 22 and just one horizontal conductor 20 in each of the six horizontal rows that the vertical conductor crosses. This limitation is imposed on the general interconnect because the circuitry needed to selectably allow a connection between intersecting conductors takes up a certain amount of area on the chip and this chip area is limited.

The interconnection circuitry shown in FIG. 5 further includes groups of vertical LAB input conductors 24 associated with each LAB 14 for conveying signals from the global horizontal conductors 20 intersected by conductors 24 into the LEs 12 in that LAB. The conductors 24 are part of the LAB interconnect which is local to just one LAB. Finally, the interconnection circuitry shown in FIG. 5 includes a set of universal fast interconnect conductors 30 which are globally connected to all LABs and are designed to transmit fast signals throughout the PLD. Although other numbers of conductors can be used if desired, in the depicted embodiment there are twenty four conductors in each group of LAB input conductors 24 and there are four universal fast conductors 30.

Figure 6:
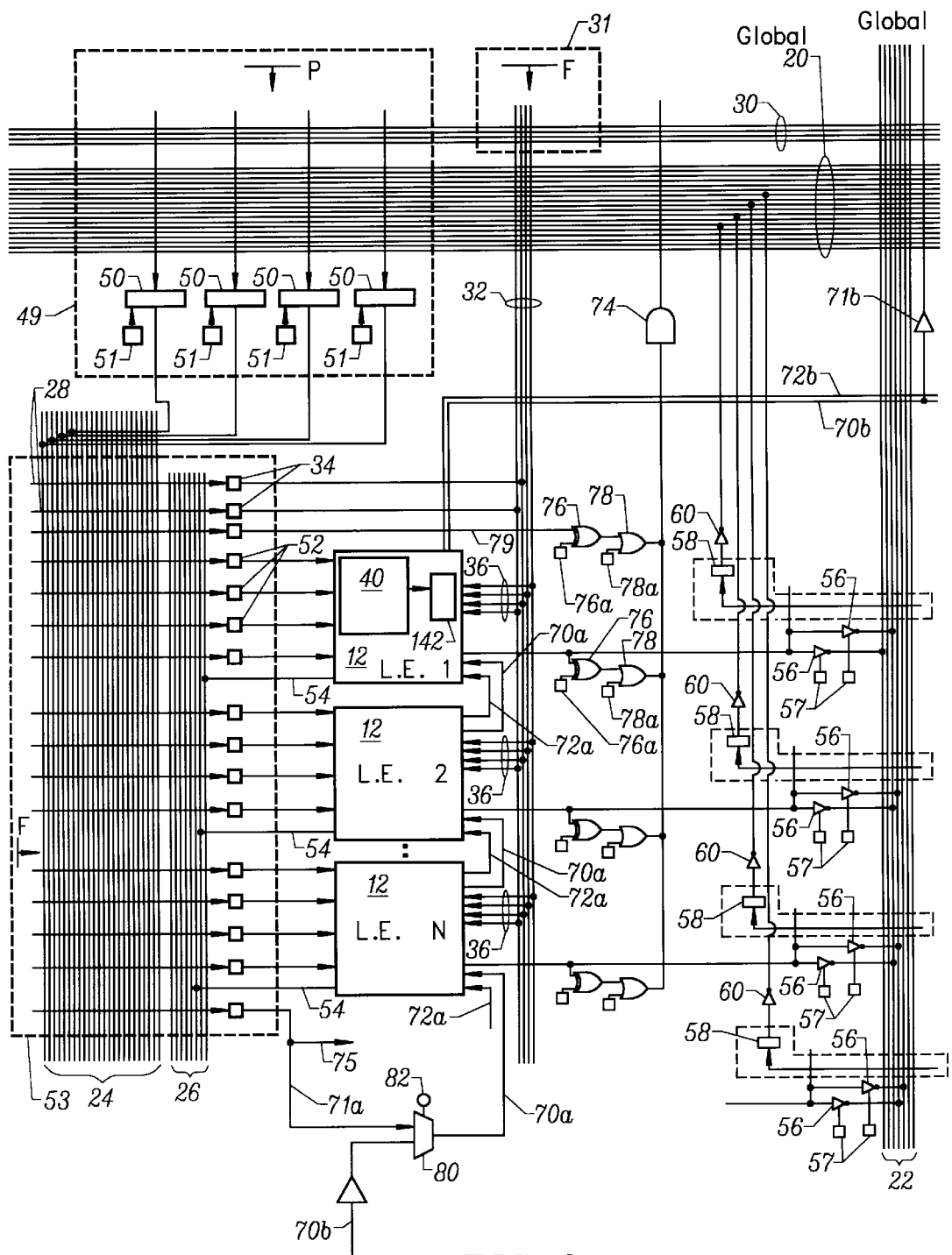
FIG. 6 is a schematic block diagram showing a LAB-based wide-input AND gate according to the invention.

Turning now to FIG. 6, which shows one possible implementation of part of a typical LAB 14 incorporating enhancements according to the invention, three representative LEs 12 are shown. Although LEs 12 can be implemented in other ways (e.g., as product-term-based macrocells), in the illustrative embodiment shown in FIG. 6 each LE 12 includes a look up table or universal logic block ("ULB") 40 and a flip-flop type device 142.

In addition to the above-described representative LEs 12, FIG. 6 shows portions of representative global horizontal conductors 20, global vertical conductors 22, local LAB input conductors 24, local inter-LAB feed-back conductors 26, and universal fast conductors 30. Each of LAB input conductors 24 can be connected to a selected one (or more) of conductors 20 and 30 via a programmably controlled programmable logic connector ("PLC") 50 (only some of which are shown in FIG. 6). Local inter-LAB conductors 26 connect only to inter-LAB signals and are used primarily for feed-back of LE outputs through lines 54 to the inputs of other LEs in the same LAB.

PLCs 50 can be implemented in any of a wide variety of ways. For example, each PLC 50 can be a relatively simple programmable connector such as a plurality of switches for connecting any one of several inputs to an output. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") as described in more detail below (although with certain PLC implementations (e.g., fuses and metal optional links) separate FCE devices are not required, so that in those cases the depiction of FCE devices in the accompanying drawings merely indicates that the PLCs are programmable). In the depicted embodiment each PLC 50 is a 15-to-1 multiplexer which is controlled by programmable function control elements ("FCEs") 51 to connect one of its fifteen inputs to its output. Each of the fifteen inputs is the signal on a predetermined respective one of conductors 20 or 30. There is one PLC 50 for each of the twenty four LAB input conductors 24. Each of conductors 20 and 30 is connected to two of PLCs 50. Accordingly, each of conductors 20 and 30 is connectable to two of conductors 24. The letter P and the associated arrow symbol inside dotted line 49 indicate that the population of connections from conductors 20 and 30 to the inputs of each of PLCs 50 is a partial population meaning that not every intersection indicates a possible interconnection.

Like PLCs 50, FCEs 51 can also be implemented in any of several different ways. For example, FCEs 51 can be SRAMs, DRAMs, first-in first-out ("FIFO") memories, EPROMs, EEPROMS, function control registers ferroelectric memories, fuses, antifuses, or the like.

Each of the four data inputs to each LE 12 can be connected to any one (or more) of LAB input conductors 24 and/or any one (or more) of local conductors 26 via a PLC 52. PLCs 52 (and similar PLCs 34 which are discussed below) may have any of the characteristics described above for the general case of PLCs 50. However, in the depicted, presently preferred embodiment each of PLCs 52 (and each similar PLC 34) is a 32-to-1 multiplexer so that any one of the twenty-four LAB input conductors 24 or any one of the eight local conductors 26 can be connected to each LAB data input. Accordingly, the letter F and the associated arrow symbol inside chain dotted line 59 indicate that the population of connections from conductors 24 and 26 to PLCs 34 and 52 is a full population meaning that each intersection of lines indicates a possible interconnection. With these interconnections just described, any of the signals on the global horizontal lines 20 in that row or on universal fast interconnects 30 may be connected to any of the LE inputs. To avoid overcrowding the drawing, the FCEs (similar to above-described FCEs 51) for programmably controlling PLCs 34 and 52 are not shown separately, but rather are assumed to be part of elements 34 and 52.

According to the invention, at least one LAB 14 is provided with a wide input AND gate 74. This AND gate is connectable to the outputs of up to all of the LEs 12 in LAB 14 as shown. The LE 12 output lines are connectable to AND gate 74 via XOR gates 76 which provide a selectable inversion function under control of FCE 76a and OR gates 78, which allows selectable connection of any of the LE outputs to AND gate 74. The details of these improvements according to the invention are explained further with reference to FIG. 7. In one embodiment of the invention, the output of AND gate 74 is connectable to lines in the global interconnect 20 and 30 as shown. In a further embodiment, AND gate 74 may include one or more input lines 79 connectable to the LAB-based interconnects 24 or 26. This embodiment would allow the outputs of the LEs to be further logically combined with a signal from the global interconnect via the LAB interconnect.

There are two other types of LE interconnections shown in FIG. 6 which require discussion. The first of these is carry chain interconnection represented in part by conductors 70a and 70b. These interconnections allow a carry out output of each LE 12 to be used as a carry in input to an adjacent or nearby LE as shown, for example, in commonly assigned, co-pending patent application Ser. No. 07/880,752, now U.S. Pat. No. 5,274,581, incorporated herein by reference for all purposes. For example, carry chain conductors 70a allow the carry out output of each LE 12 shown in FIG. 6 to be the carry in input to the next higher LE in that Fig. Similarly, carry chain conductor 70b runs from the top-most LE 12 in the LAB fragment shown in FIG. 6 to the bottom-most LE in the horizontally adjacent LAB in the adjacent column of LABS. This allows the carry chain to continue from LAB to LAB if desired. Also illustrated in FIG. 6 is an improvement to the LAB carry-chain which is fully discussed in related co-pending U.S. patent application Ser. No. 08/497,213, entitled PROGRAMMABLE LOGIC ARRAY INTEGRATED CIRCUITS WITH ENHANCED CARRY ROUTING. This improvement consists of LAB-based interconnect carry input connection 71a, selector 80, FCE 82 and other associated circuitry as described in the cited application.

The other type of LE interconnection remaining to be discussed is illustrated by representative conductors 72a and 72b in FIG. 6 (see also commonly assigned, co-pending application Ser. No. 07/880,888). These conductors are called cascade connect conductors. They allow the data outputs of adjacent or nearby LEs 12 to be logically combined, if desired, to perform more complex logic functions without the need to pass intermediate data through the general interconnection network. The manner in which cascade connect conductors 72 are employed in the LEs is shown in detail in FIG. 12.

Figure 7:
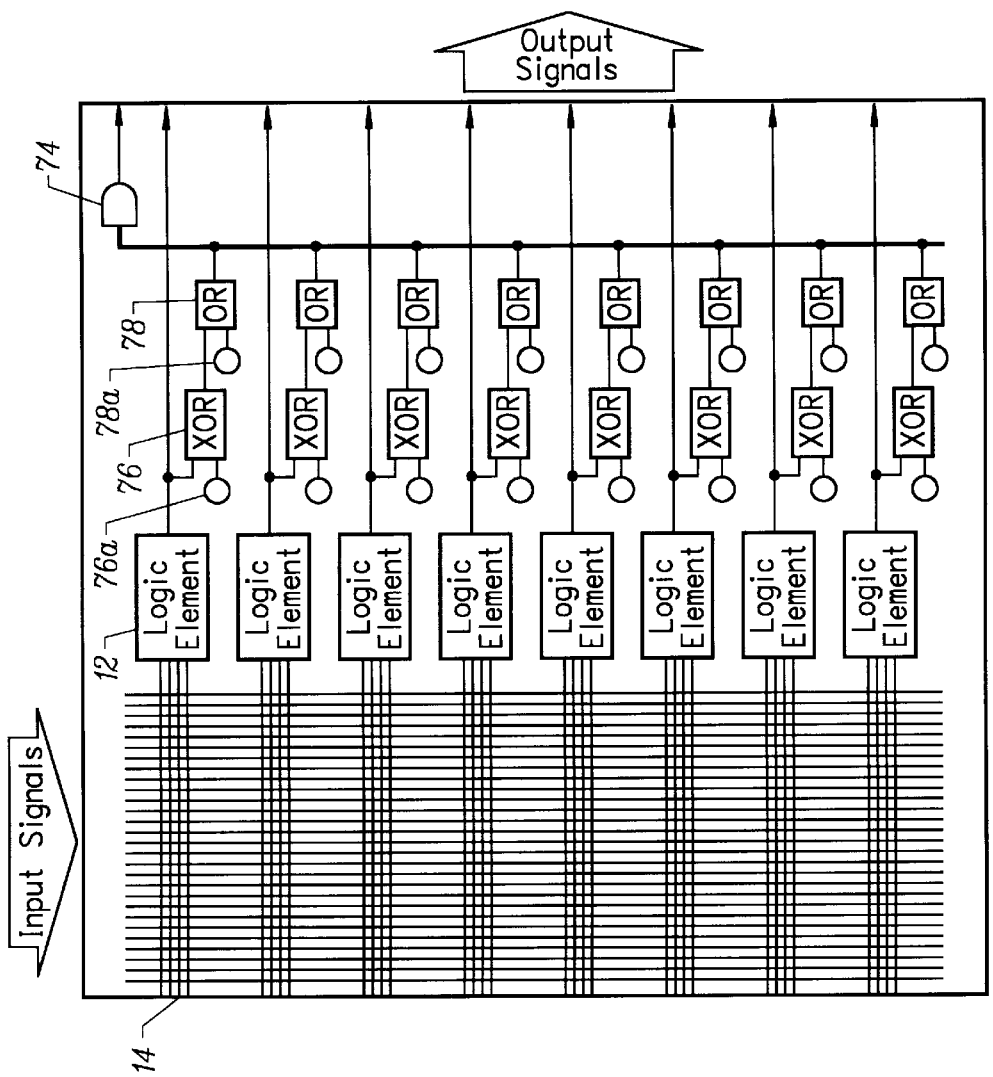
FIG. 7 is a simplified block diagram showing a LAB-based wide-input AND gate according to the invention.

FIG. 7 is a simplified block diagram of a LAB 14 showing only those details necessary to illustrate the invention. FIG. 7 illustrates a LAB 14 having eight LEs 12 and having LAB-input lines 24. A LAB-based wide AND output gate 74 is shown connecting the eight LE output lines. Each of the output lines is connectable to AND gate 74 via an XOR gate 76 which provides a selectable inversion function under control of FCE 76a and an OR gate 78 with one of its inputs fed by FCE 78a, which allows selectable connection of any of the LE outputs to AND gate 74, i.e., when the FCE 78a is in the true state, the output of OR gate 78 is always true regardless of the output of its associated LE 12. Therefore, when an FCE 78a is in the true state, the output of AND 74 gate does not depend on the output of the LE 12 associated with that FCE and that LE is effectively disconnected for the input of AND gate 74.

Figure 8:
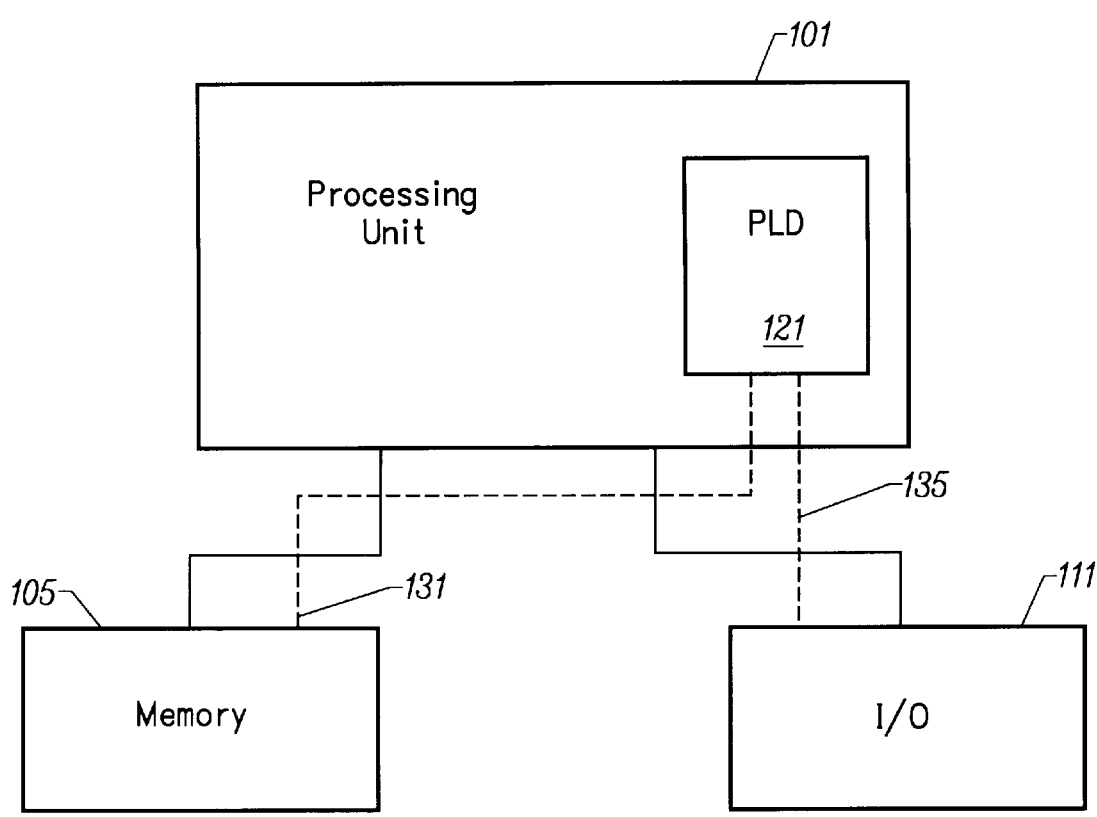
FIG. 8 is a block diagram of a digital processing system including a PLD with LAB-based output routing according to the invention.

FIG. 8 shows a block diagram of a digital system within which the present invention may be embodied. In the particular embodiment of FIG. 8, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. I/O 111 may also be a connection or bus to another processing system that provides input or receives output from 101. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 8. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 8 may embody a plurality of PLDs 121, each performing different system functions.

The system shown in FIG. 8 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 8, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

In conclusion, the present invention provides various embodiments for efficient implementation of fast wide exclusive OR or exclusive NOR functions in a product-term based programmable logic device. While the above is a complete description of the several embodiments, it is possible to use various alternatives, modifications and equivalents. For example, a dedicated wide XOR that receives logic cell outputs in a logic array block can be made larger and located such that it receives logic cell output from more than one logic array block. Also, it is to be understood that the XOR gate in every embodiment described can be programmably converted into an XNOR gate by inclusion of a multiplexer at an additional input as shown in FIG. 1. The scope of the present invention should therefore not be determined with reference to the above description, but should instead, be determined with reference to the appended claims along with their full scope of equivalents.

The invention has now been explained with reference to specific embodiments. However, a number of variations to the invention will be obvious to anyone with skill in the art. For example, the invention need not be limited to circuits that are commonly thought of as PLDs; other types of configurable counter circuits or adder circuits may employ the invention. Also, the particular design of the LABs is not determinative. The invention may be used with SOP-based LABs as well as LUT-based LABs. The invention may also be employed in PLDs having a wide variety of LAB and LE architectures and a number of different interconnect strategies. Additionally, the particular configurations of the global and local interconnect are not determinative. Circuits in which the invention may be employed may employ either a more limited or more extensive global interconnect than those depicted in the specific embodiments. Finally, systems incorporating the invention may be any type of information processing system or subsystem. It is therefore intended that the invention not be limited except as specified in the attached claims.

What is claimed is:

1. A configurable electronic device comprising:
   a plurality of logic elements grouped into a plurality of logic blocks, at least one logic element comprising a plurality of outputs and a plurality of inputs wherein said outputs are a logical function of said inputs, and wherein inputs to at least two of said logic elements are programmably connectable to a connection matrix such that said at least two of said logic elements can be programmably connected to the same input lines and wherein at least one logic block has associated with it; and
   a wide-input AND gate, said wide-input AND gate having inputs connectable to a plurality of outputs of said plurality of logic elements and having an output that is a logical function of its inputs wherein at least one of said logic elements is comprised of a plurality of look-up tables.

2. The configurable electronic device according to claim 1 wherein data in said plurality of look-up tables is stored in static random access memory.

3. A configurable logic device comprising:
   a plurality of logic array blocks (LABs), arranged in a plurality of rows and columns, at least one LAB having a plurality of inputs and outputs and capable of performing a logic function such that said at least one LAB's outputs represent a logical function of its inputs, said logic function being programmable during chip manufacture or use;
   a general interconnect structure comprising a plurality of rows of conductors and a plurality of columns of conductors, said interconnect structure capable of routing select signals between said columns of conductors and said rows of conductors;
   LAB output lines for selectively connecting said LAB outputs to said general interconnect structure;
   at least one LAB-based interconnect associated with a particular LAB capable of connecting selected lines of said general interconnect to selected input lines of said LAB;
   wherein at least one LAB is comprised of a plurality of configurable logic elements, each of said logic elements having at least one output and a plurality of inputs and each of said logic elements performing a function such that its outputs are a logical function of its inputs; and
   at least one wide-input AND gate, said wide-input AND gate having inputs connectable to a plurality of outputs of said plurality of logic elements without passing through said general or said LAB-based interconnect and having an output that is a combinatorial logical function of its inputs.

4. The configurable electronic device according to claim 3 wherein at least one of said logic element outputs is selectively connectable to said wide-input AND gate by means of an OR gate with its output connected to said wide-input AND gate, one input connected to the output of said at least one logic element and a second input connected to a programmable store wherein said programmable store may be programmably set to either a true or false logic value.

5. The configurable electronic device according to claim 3 wherein at least one of said logic element outputs may be selectively inverted prior to connection to said wide-input AND gate by means of an XOR gate with its output connectable to said wide-input AND gate, one input connected to the output of said at least one logic element and a second input connected to a programmable store wherein said programmable store may be programmably set to either a true or false logic value.

6. The configurable logic device of claim 3 wherein said at least one LAB-based input interconnect is a fully populated interconnection between inputs to logic circuits of said LAB and outputs of a plurality of multiplexers, said multiplexers having their inputs connected to conductors in said general interconnect.

7. The configurable logic device of claim 6 wherein the outputs of said multiplexers are selected by a programmable store.

8. The configurable logic device of claim 6 wherein the programmable store is an SRAM cell.

9. The configurable logic device of claim 3 wherein an output of said wide-input AND gate may be selectively connected to a line in said general interconnect.

10. The configurable logic device of claim 3 wherein the output of said wide-input AND gate is connectable to said general interconnect structure.

11. The configurable logic device of claim 3 wherein at least one input of said wide-input AND gate is connectable to said at least one LAB-based interconnect.

12. A configurable logic device comprising:
    a plurality of logic array blocks (LABs), arranged in a plurality of rows and columns, at least one LAB having a plurality of inputs and outputs and capable of performing a logic function such that said at least one LAB's outputs represent a logical function of its inputs, said logic function being programmable during chip manufacture or use;
    a general interconnect structure comprising a plurality of rows of conductors and a plurality of columns of conductors, said interconnect structure capable of routing select signals between said columns of conductors and said rows of conductors;

LAB output lines for selectively connecting said LAB outputs to said general interconnect structure;

at least one LAB-based interconnect associated with a particular LAB capable of connecting selected lines of said general interconnect to selected input lines of said LAB;

wherein at least one LAB is comprised of a plurality of logic elements, each of said logic elements having at least one output and a plurality of inputs and each of said logic elements performing a function such that its outputs are a logical function of its inputs; and at least one wide-input AND gate, said wide-input AND gate having inputs connectable to a plurality of outputs of said plurality of logic elements and having an output that is a combinatorial logical function of its inputs wherein the LABs are comprised of a plurality of look-up tables.

13. A digital information processing system comprising:
an input device;
an output device;
a main processor;
a memory; and
at least one programmable logic device comprising:
a plurality of logic array blocks (LABs), arranged in a plurality of rows and columns, at least one LAB having a plurality of inputs and outputs and capable of performing a logic function such that said at least one LAB's outputs represent a logical function of its inputs, said logic function being programmable during chip manufacture or use;

a general interconnect structure comprising a plurality of rows of conductors and a plurality of columns of conductors, said interconnect structure capable of routing select signals between said columns of conductors and said rows of conductors;

LAB output lines for selectively connecting said LAB outputs to said general interconnect structure;

at least one LAB-based interconnect associated with a particular LAB capable of connecting selected lines of said general interconnect to selected input lines of said LAB;

wherein at least one LAB is comprised of a plurality of logic elements, each of said logic elements having at least one output and a plurality of inputs and each of said logic elements performing a function such that its outputs are a logical function of its inputs; and at least one wide-input AND gate, said wide-input AND gate having inputs connectable to a plurality of outputs of said plurality of logic elements and having an output that is a combinatorial logical function of its inputs;

wherein said logic blocks are comprised of a plurality of look-up tables and wherein said general interconnect structure comprises a plurality of rows and columns of conductors and wherein data in said look-up tables is stored in static random access memory and further comprising a plurality of multiplexers with inputs connected to said general interconnect structure and outputs connected to said array of input interconnections.

14. The digital information processing system of claim 13 wherein at least one LAB further comprises an enhanced carry chain comprising:

a direct carry output for transmitting a carry signal to an adjacent LAB;

a general interconnect carry output line for selectively connecting the carry output to a line in the general interconnect; and wherein said at least one LAB-based interconnect associated with at least one LAB includes a plurality of LAB input carry_in lines connectable to a LAB's carry input.

15. A programmable logic device comprising:
a plurality of logic array blocks; and
a programmable interconnect array coupled to inputs and outputs of said plurality of logic array blocks for programmably connecting outputs of said logic array blocks to inputs of other logic array blocks,
wherein a logic array block comprises:
a plurality of logic cells, each one of said plurality of logic cells having a plurality of inputs and one or more outputs, each logic cell having logic circuitry programmably performing logical combinations on signals at said plurality of inputs; and
an exclusive OR type circuit having an output and a plurality of inputs, each one of said plurality of inputs of said exclusive OR type circuit being coupled through a programmable multiplexer to an output of each of said plurality of logic cells, respectively.

16. The programmable logic device of claim 15 wherein said programmable multiplexer comprises a first and a second input, a control input and an output,
said first input of said programmable multiplexer coupled to an output of a corresponding one of said plurality of logic cells,
said second input of said programmable multiplexer coupled to a logic low level,
said control input coupled to a programmable element, and
said output of said programmable multiplexer coupled to a corresponding one of said plurality of inputs of said exclusive OR type circuit.

17. The programmable logic device of claim 16 wherein said exclusive OR type circuit is one of an exclusive OR and an exclusive NOR gates.

18. The programmable logic device of claim 17 wherein said logic cell further includes:
a plurality of AND gates having inputs coupled to said plurality of inputs of said logic cell, each of said plurality of AND gates generating a product term at an output;
a product term select matrix having inputs respectively coupled to an output of each of said plurality of AND gates, said product term select matrix for programmably selecting product terms to couple to its outputs; and
an OR gate having a plurality of inputs coupled to said outputs of said product term select matrix, and an output coupled to an output of said logic cell.

19. The programmable logic device of claim 18 wherein said first input of each of said plurality of programmable multiplexers couples to a selected product term output of said product term select matrix.

20. The programmable logic device of claim 18 wherein said first input of each of said plurality of programmable multiplexers couples to said output of said OR gate of an associated logic cell.

21. The programmable logic device of claim 16 wherein said exclusive OR type circuit comprises an additional input coupled to an output of an additional programmable multiplexer, said additional programmable multiplexer having a first input coupled to a logic low level, a second input coupled to a logic high level, and a control input coupled to a programmable element.

22. In a programmable logic device, a logic cell having a plurality of inputs and an output, said logic cell comprising:
- a plurality of AND gates having inputs coupled to the plurality of logic cell inputs, each of said AND gates generating a product term at an output;
- a plurality of multiplexers corresponding to said plurality of AND gates, each of said plurality of multiplexers receiving, at a first input, a corresponding one of said output of said AND gates, and at a second input a logic low level signal; and
- a wide exclusive OR type circuit having an output coupled to the logic cell output, and a plurality of inputs corresponding to said plurality of AND gates, each one of said plurality of inputs of said exclusive OR type circuit receiving an output of corresponding one of said plurality of multiplexers.

23. The programmable logic device of claim 22 wherein said wide exclusive OR type circuit comprises an additional input coupled to an output of an additional programmable multiplexer, said additional programmable multiplexer having a first input coupled to a logic low level, a second input coupled to a logic high level, and a control input coupled to a programmable element.

24. A logic cell for a programmable logic device comprising:
- a plurality of AND gates having inputs coupled to a plurality of inputs of the logic cell, respectively, said plurality of AND gates generating a corresponding plurality of product terms at a plurality of outputs;
- a product term select matrix coupled to said plurality of outputs of said plurality of AND gates, said product term select matrix for programmably routing selected ones of said plurality of product terms to a plurality of outputs;
- an OR gate having a plurality of inputs respectively coupled to a selected group of said plurality of outputs of said product term select matrix;
- a first multiplexer having a first input coupled to an output of said OR gate, a second input coupled to a logic low level, a control input coupled to a first programmable element, and an output;
- a second multiplexer having a first input coupled to a cascade_in input of the logic cell, a second input coupled to a logic low level, a control input coupled to a second programmable element, and an output; and
- an exclusive OR (XOR) gate having a first input coupled to said output of said first multiplexer, a second input coupled to said output of said second multiplexer, a third input coupled to a selected output of said product term select matrix, and an output coupled to a cascade_out output of the logic cell.

25. The logic cell of claim 24 further comprising:
- a third multiplexer coupled between said third input of said XOR gate and said product term select matrix, said third multiplexer having a first input coupled to said selected output of said product term select matrix, a second input coupled to a logic low level, a control input coupled to a third programmable element, and an output coupled to said third input of said XOR gate.

26. The logic cell of claim 25 further comprising a fourth multiplexer having a first input coupled to said output of said XOR gate, a second input coupled to said output of said OR gate, a control input coupled to a fourth programmable element, and an output coupled to an output of said logic cell.

27. The logic cell of claim 25 further comprising a bypass multiplexer having a first input coupled to said cascade_in input, a second input coupled to said output of said XOR gate, a control input coupled to a fourth programmable element, and an output coupled to said cascade_out output.

28. The logic cell of claim 26 further comprising a fifth multiplexer having a first input coupled to said output of said OR gate, a second input, a control input coupled to a fifth programmable element, and an output coupled to a cascade_OR_out output.

29. The logic cell of claim 28 further comprising a sixth multiplexer having a first input coupled to said cascade_in input, a second input coupled to a logic low level, a control input coupled to a fifth programmable element, and an output coupled to an input of said OR gate, and
wherein said bypass multiplexer further comprises a third input coupled to said output of said OR gate.

30. The logic cell of claim 28 wherein said second input is connected to a cascade_in input.

31. A logic cell for a programmable logic device, comprising:
- a plurality of AND gates having inputs coupled to a plurality of inputs of the logic cell, respectively, said plurality of AND gates generating a corresponding plurality of product terms at a plurality of outputs;
- a product term select matrix coupled to said plurality of outputs of said plurality of AND gates, said product term select matrix for programmably routing selected ones of said plurality of product terms to a plurality of outputs;
- an OR gate having a plurality of inputs respectively coupled to a selected group of said plurality of outputs of said product term select matrix;
- a first multiplexer having a first input coupled to an output of said OR gate, a second input coupled to a logic low level, a control input coupled to a first programmable element, and an output;
- a second multiplexer having a first input coupled to a cascade_in input of the logic cell, a second input coupled to a logic low level, a control input coupled to a second programmable element, and an output;
- an exclusive OR (XOR) gate having a first input coupled to said output of said first multiplexer, a second input coupled to said output of said second multiplexer, a third input coupled to a selected output of said product term select matrix, and an output coupled to a cascade_out output of the logic cell;
- a third multiplexer coupled between said third input of said XOR gate and said product term select matrix, said third multiplexer having a first input coupled to said selected output of said product term select matrix, a second input coupled to a logic low level, a control input coupled to a third programmable element, and an output coupled to said third input of said XOR gate;
- a fourth multiplexer having a first input coupled to said output of said XOR gate, a second input coupled to said output of said OR gate, a control input coupled to a fourth programmable element, and an output coupled to an output of said logic cell; and
- a bypass multiplexer having a first input coupled to said cascade_in input, a second input coupled to said output of said XOR gate, a control input coupled to a fifth programmable element, and an output coupled to said cascade_out output.

32. A method for providing a dedicated wide exclusive OR type circuit in a programmable logic device having a plurality of logic cells, the method comprising:

(a) receiving a plurality of product terms;

(b) providing an OR gate in a logic cell to selectively sum said plurality of product terms;

(c) providing an exclusive OR type circuit;

(d) programmably coupling an output of said OR gate, a cascade_in input signal, and a selected product term to inputs of said exclusive OR type circuit, respectively;

(e) supplying an output of said exclusive OR type circuit as a cascade_out output of the logic cell; and (f) coupling said cascade_out output to said cascade_in input of a plurality of logic cells to form a chain, thereby implementing an embedded wide exclusive OR type circuit.

* * * * *